(12) United States Patent
Yi (10) Patent No.: US 9,698,577 B2
(45) Date of Patent: Jul. 4, 2017

(54) PORTABLE POWER SUPPLY UNIT WITH BUS BAR ADAPTER AND TOOL-LESS CONNECTION

(71) Applicant: SanDisk Technologies LLC, Plano, TX (US)

(72) Inventor: George Yi, Fremont, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/836,741

(22) Filed: Aug. 26, 2015

(65) Prior Publication Data

US 2016/0329689 A1 Nov. 10, 2016

Related U.S. Application Data

(60) Provisional application No. 62/158,339, filed on May 7, 2015.

(51) Int. Cl.
*H02B 1/20* (2006.01)
*H05K 7/14* (2006.01)
(Continued)

(52) U.S. Cl.
CPC .............. *H02B 1/20* (2013.01); *H01L 24/48* (2013.01); *H01L 25/072* (2013.01); *H02B 1/056* (2013.01); *H02B 1/21* (2013.01); *H05K 7/1492* (2013.01)

(58) Field of Classification Search
CPC ....... H01L 2924/00; H01L 2224/48227; H01L 2224/49111; H01L 2924/181; H01L 2924/0002; H01L 2224/73265; H01L 25/072; H01L 24/48; H02B 1/056; H02B 1/21; H02B 1/03; H02B 1/04; H02B 1/20; H01H 9/104; H01H 1/20; H01H 21/16; H01H 85/0241; H01H 9/282; H01H 71/08;
(Continued)

(56) References Cited

U.S. PATENT DOCUMENTS 3,710,199 A 1/1973 Cignoni, Jr.
4,614,383 A 9/1986 Polley et al.
(Continued)

OTHER PUBLICATIONS

Facebook, "Open Rack Specification V2," Revision 4, Apr. 11, 2014, 9 pages.
(Continued)

*Primary Examiner* — Adam B Dravininkas
(74) *Attorney, Agent, or Firm* — Morgan, Lewis & Bockius LLP (57) ABSTRACT

A portable power unit is used for powering a rack-mountable equipment module, in which the equipment module includes an equipment chassis and a bus bar connector extending from the equipment chassis, and in which the bus bar connector is configured to engage a power distribution system of an equipment rack when the equipment module is mounted in the equipment rack. One aspect is directed to a portable power supply unit generally including a bus bar adapter electrically connected to a DC power supply, a mount for supporting the bus bar adapter, the mount having an end, and a tool-less connection electrically connected to the bus bar adapter and extending from the end of the mount, in which the tool-less connection is configured for engaging the bus bar connector of the equipment module.

22 Claims, 5 Drawing Sheets

(51) Int. Cl.
  *H01L 25/07* (2006.01)
  *H01L 23/00* (2006.01)
  *H02B 1/21* (2006.01)
  *H02B 1/056* (2006.01)

(58) Field of Classification Search
  CPC ...... H02M 7/003; H02M 7/04; H05K 7/1484; H05K 7/1432; H05K 7/1468; H05K 7/026; H05K 7/1492
  USPC ......... 361/611, 614, 615, 622–626, 637–640
  See application file for complete search history.

(56) References Cited

U.S. PATENT DOCUMENTS

| | | | |
|---|---|---|---|
| 5,196,987 A * | 3/1993 | Webber | H01R 25/16 361/624 |
| 5,245,527 A * | 9/1993 | Duff | H05K 7/1432 361/610 |
| 6,070,742 A | 6/2000 | McAnally et al. | |
| 6,071,142 A | 6/2000 | Blackman | |
| 6,160,699 A * | 12/2000 | Gibson | H02B 1/21 361/643 |
| 6,303,864 B1 | 10/2001 | Johnson et al. | |
| 6,305,556 B1 | 10/2001 | Mayer | |
| 6,326,547 B1 | 12/2001 | Saxby et al. | |
| 6,327,139 B1 | 12/2001 | Champion et al. | |
| 6,435,354 B1 | 8/2002 | Gray et al. | |
| 6,501,020 B2 | 12/2002 | Grant et al. | |
| 6,523,918 B1 | 2/2003 | Baiza | |
| 6,544,057 B1 | 4/2003 | Stremick et al. | |
| 6,600,665 B2 | 7/2003 | Lauchner | |
| 6,747,874 B2 | 6/2004 | McKinnon et al. | |
| 6,767,237 B1 | 7/2004 | Shih | |
| 6,805,248 B2 | 10/2004 | Champion et al. | |
| 6,854,605 B2 | 2/2005 | Wrycraft | |
| 6,902,069 B2 | 6/2005 | Hartman et al. | |
| 6,945,504 B2 | 9/2005 | Chen et al. | |
| 6,972,949 B1 | 12/2005 | Helgenberg et al. | |
| 7,009,112 B1 | 3/2006 | Mead et al. | |
| 7,023,708 B2 | 4/2006 | Nguyen et al. | |
| 7,026,551 B2 | 4/2006 | Franz et al. | |
| 7,121,412 B2 | 10/2006 | Richards et al. | |
| 7,168,576 B2 | 1/2007 | Williams | |
| 7,189,924 B1 | 3/2007 | Popescu et al. | |
| 7,195,511 B1 | 3/2007 | Ornt et al. | |
| 7,201,279 B1 | 4/2007 | Mimlitch, III et al. | |
| 7,258,583 B1 | 8/2007 | Baiza | |
| 7,429,701 B1 | 9/2008 | Kushnir et al. | |
| 7,472,795 B2 | 1/2009 | Dubon et al. | |
| 7,473,846 B2 | 1/2009 | Doerr et al. | |
| 7,554,819 B2 | 6/2009 | Chen et al. | |
| 7,568,935 B1 | 8/2009 | Gonzalez et al. | |
| 7,654,398 B2 | 2/2010 | Bridges et al. | |
| 7,695,305 B1 | 4/2010 | Ray et al. | |
| 7,850,478 B2 | 12/2010 | Lin et al. | |
| 7,901,241 B1 | 3/2011 | Larkin | |
| 8,045,343 B2 | 10/2011 | Fan et al. | |
| 8,134,074 B2 | 3/2012 | Ong et al. | |
| 8,167,146 B2 | 5/2012 | Yu et al. | |
| 8,186,634 B2 | 5/2012 | Chen et al. | |
| 8,231,014 B2 | 7/2012 | Chen et al. | |
| 8,337,236 B2 | 12/2012 | Shu | |
| 8,456,845 B2 | 6/2013 | Liu | |
| 8,729,389 B2 | 5/2014 | Hallett et al. | |
| 8,986,040 B2 | 3/2015 | Garofalo et al. | |
| 9,144,174 B2 | 9/2015 | Chen et al. | |
| 9,210,828 B2 | 12/2015 | Liao et al. | |
| 9,391,402 B2 | 7/2016 | Lin | |
| 2001/0026436 A1 * | 10/2001 | Tanzer | H01R 25/006 361/610 |
| 2003/0209361 A1 | 11/2003 | Sivertsen | |
| 2004/0120134 A1 | 6/2004 | Nguyen et al. | |
| 2006/0011380 A1 | 1/2006 | Pierce | |
| 2006/0046557 A1 | 3/2006 | Pulizzi et al. | |
| 2006/0113433 A1 | 6/2006 | Chen et al. | |
| 2007/0291430 A1 * | 12/2007 | Spitaels | H01R 13/6666 361/79 |
| 2008/0264880 A1 | 10/2008 | Wagner et al. | |
| 2009/0078834 A1 | 3/2009 | Chen et al. | |
| 2011/0100933 A1 | 5/2011 | Kitten | |
| 2012/0162883 A1 * | 6/2012 | Jai | G06F 1/181 361/679.02 |
| 2012/0190225 A1 * | 7/2012 | Bessyo | H01R 13/64 439/177 |
| 2013/0039003 A1 * | 2/2013 | Li | H05K 7/1492 361/679.48 |
| 2013/0058028 A1 * | 3/2013 | Lu | G06F 1/181 361/679.31 |
| 2013/0135792 A1 * | 5/2013 | Deshayes | H02B 1/207 361/637 |
| 2013/0341471 A1 | 12/2013 | Yang et al. | |
| 2014/0183306 A1 | 7/2014 | Chen et al. | |
| 2015/0036272 A1 * | 2/2015 | Tachibana | G06F 1/189 361/679.4 |
| 2015/0098168 A1 | 4/2015 | Liang | |
| 2015/0103488 A1 | 4/2015 | Tanaka | |
| 2016/0037667 A1 | 2/2016 | Wu | |

OTHER PUBLICATIONS

International Search Report and Written Opinion dated Jul. 26, 2016, received in International Patent Application No. PCT/US2016/027924, which corresponds to U.S. Appl. No. 14/688,954, 12 pages (Yi).

* cited by examiner

PORTABLE POWER SUPPLY UNIT WITH BUS BAR ADAPTER AND TOOL-LESS CONNECTION

CROSS-REFERENCES TO RELATED APPLICATIONS

This application claims priority to U.S. Provisional Patent Application No. 62/158,339 filed May 7, 2015 and entitled PORTABLE POWER SUPPLY UNIT WITH BUS BAR ADAPTER AND TOOL-LESS CONNECTION, the entire contents of which is incorporated herein for all purposes by this reference.

TECHNICAL FIELD

The disclosed embodiments relate generally to a portable power supply unit with a bus bar adapter and a tool-less connection.

BACKGROUND

It is well known to use equipment racks for mounting and supporting multiple equipment modules. For example, 19-inch racks are widely used in modern data centers, ISP facilities and corporate server rooms for mounting and supporting various equipment modules, including computing, telecommunication, audio, and/or video equipment. Similarly, a 23-inch rack is standardized to accommodate wider equipment modules. More recently, the Open Compute Project (OCP) initiated by Facebook calls for an OCP rack that has the same outside dimensions as a conventional 19-inch rack, but allows for wider equipment modules to fit within the overall footprint of a 19-inch rack.

In general, an OCP rack mountable product (e.g., network switch, server, data storage system, etc.) is designed without an integral power supply. Instead, the product is powered by a central power distribution system (PDS) of the OCP rack. The product is electrically connected to the PDS via bus bars (e.g., a 12 VDC bus bar and a ground bus bar) located along the rear of the OCP rack. The product may be electrically connected to the rack bus bars via "flying lead" power cables, which are secured by lugs, screws, nuts and the like. And more recently, the products may include a specialized blind-mate bus bar clip that is compatible with the bus bars of an OCP rack. For example, the products may include a specialized clip such as the OCP Connector provided by Methode Electronics, Inc. of Chicago, Ill.

Unless the product is installed in the OCP rack, however, the product cannot be readily turned on. As such, a technician or a user generally must install the product on an OCP rack in order to use the product. And one will appreciate that when a only one or two products are to be used, it may be overkill to devote an entire OCP rack to support and power just one or two products, especially in light of the fact that OCP racks include several "innovation zones" that are each sized at 10 OpenUs and are capable of supporting a number of products.

Furthermore, it may be impracticable or even impossible to have the product installed in an OCP rack. For example, an OCP rack may not be available during product field tests and/or during beta tests at customer sites. Similarly, it may be impracticable or even impossible to install the product in an OCP rack during various product development stages, for example, during hardware "bring up", while testing the product on a bench table, during engineering validation tests where the product is placed in an environmental chamber or on a shaker, etc. In such instances, it may be impracticable or impossible to place an OCP rack atop a bench table, inside an environmental changer, or mounted on a shaker.

And Since OCP rack-mountable products rely on the use of the central PDS of an OCP rack, it is inconvenient for both manufacturers and customers to perform out-going product function checks before shipping and/or incoming product function checks after receiving by installing and uninstalling the product on an OCP rack.

In order to power a product that is not installed in an OCP rack, a user must find an alternative DC power supply and somehow connect the product to the alternative DC power supply. This is often done using "flying lead" power cables to interconnect the product and the DC power supply secured by lugs, screws, nuts and the like. This approach has several problems. First, there is a high possibility of damaging the product by wrong polarity power connection due to lack of key-lock polarity connection. Second, the use of "flying lead" cables may lead to power loss and low efficiency due to the resistance of the cables. Third, there are significant safety and liability issues due to the nature of unmanaged cables and exposed lug connections. And fourth, tools are generally required to secure the cables, thus requiring a user to carry screwdrivers, wrenches and/or other tools to connect the cables.

In light of the foregoing, it would be beneficial to have a portable power supply which overcomes the above and other disadvantages of powering equipment-rack mountable products.

SUMMARY

Various embodiments of systems, apparatuses and devices within the scope of the appended claims each have several aspects, no single one of which is solely responsible for the attributes described herein. Without limiting the scope of the appended claims, after considering this disclosure, and particularly after considering the section entitled "Detailed Description" one will understand the aspects of various embodiments of the disclosed portable power supply unit.

One aspect is directed to a portable power unit for powering a rack-mountable equipment module, in which the equipment module includes an equipment chassis and a bus bar connector extending from the equipment chassis, where the bus bar connector is configured to engage a power distribution system of an equipment rack when the equipment module is mounted in the equipment rack.

Another aspect is directed to a portable power supply unit generally including a bus bar adapter electrically connected to a DC power supply, a mount for supporting the bus bar adapter, where the mount has an end, and a tool-less connection electrically connected to the bus bar adapter and extending from the end of the mount, and where the tool-less connection is configured for engaging the bus bar connector of the equipment module.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, apparatus or device. Finally, like reference numerals may be used to denote like features throughout the specification and figures.

DETAILED DESCRIPTION

The various embodiments described herein include systems, apparatuses and/or devices for remotely powering a rack-mountable equipment module that is usually powered while installed in an equipment rack and electrically connected to a power distribution system of the equipment rack. In particular, the various embodiments described herein include a portable power supply for powering such a rack-mountable equipment module while it is removed from the equipment rack.

(A1) More specifically, some embodiments include a portable power supply unit for powering a rack-mountable equipment module, in which the equipment module includes an equipment chassis and a bus bar connector extending from the equipment chassis, in which the bus bar connector is configured to engage a power distribution system of an equipment rack when the equipment module is mounted in the equipment rack, the portable power supply unit including: a bus bar adapter electrically connected to a DC power supply; a mount for supporting the bus bar adapter, the mount having an end; and a tool-less connection electrically connected to the bus bar adapter and extending from the end of the mount, the tool-less connection being configured for engaging the bus bar connector of the equipment module.

(A2) In some embodiments of the power supply unit of (A1), the bus bar adapter is a printed circuit board assembly (PCBA).

(A3) In some embodiments of the power supply unit of any of (A1) to (A2), the mount includes a housing for enclosing the bus bar adapter, and the tool-less connection may extend from an end of the housing.

(A4) In some embodiments of the power supply unit of (A3), the housing includes a removable cover for accessing the bus bar adapter within the housing.

(A5) In some embodiments of the power supply unit of any of (A1) to (A4), the tool-less connection serves as a DC voltage output of the bus bar adapter.

(A6) In some embodiments of the power supply unit of any of (A1) to (A5), the tool-less connection includes a first bus bar and a second bus bar spaced from the first bus bar, the first and second bus bars are electrically connected to the bus bar adapter and extend from the end of the mount, and the first and second bus bars are configured to engage the bus bar connector of the equipment module.

(A7) In some embodiments of the power supply unit of (A6), the first and second bus bars are flat metallic bars that are spaced parallel to one another.

(A8) In some embodiments of the power supply unit of any of (A6) to (A7), the first and second bus bars are configured to engage an input power connector of an Open Compute Project (OCP) product.

(A9) In some embodiments of the power supply unit of any of (A1) to (A8), the DC power supply is an AC/DC converter for converting an input AC voltage to an output DC voltage for the bus bar adapter.

(A10) In some embodiments of the power supply unit of (A9), the AC/DC converter is supported by the mount.

(A11) In some embodiments of the power supply unit of any of (A9) to (A10), the input of the AC/DC unit is configured to receive 100-240 VAC.

(A12) In some embodiments of the power supply unit of any of (A9) to (A11), the output of the AC/DC unit is configured to provide a DC voltage in the range of 12 VDC to 48 VDC.

(A13) In some embodiments of the power supply unit of any of (A9) to (A12), the portable supply unit includes a plurality of AC/DC converters, and the bus bar adapter is electrically connected to each of the AC/DC converters.

(A14) In some embodiments of the power supply unit of (A13), the bus bar adapter is connected to each of the AC/DC converters in parallel.

(A15) In some embodiments of the power supply unit of any of (A1) to (A14), the tool-less connection includes an insulating spacer separating and insulating the first and second bus bars from one another.

(A16) In some embodiments of the power supply unit of (A15), the insulating spacer includes front and rear flanges covering respective front and rear edges of the first and second bus bars.

(A17) In some embodiments of the power supply unit of any of (A1) to (A16), the tool-less connection includes insulating side plates covering respective side surfaces of the first and second bus bars.

(A18) In some embodiments of the power supply unit of any of (A1) to (A17), the mount is horizontally elongated, and the tool-less connection extends horizontally from the end of the mount.

(A19) In some embodiments of the power supply unit of (A18), the bus bar connector of the equipment module is located at a distance DB from a bottom of the equipment module, and the tool-less connection is located at said distance DB from a bottom of the mount.

(A20) In some embodiments of the power supply unit of any of (A1) to (A17), the mount is horizontally elongated and the tool-less connection extends vertically from the end of the mount.

(A21) In some embodiments of the power supply unit of (A20), the tool-less connection is dimensioned and configured to engage a bus bar connector of a rack-mountable equipment module while the power supply unit is resting on top of the rack-mountable equipment module.

(A22) In some embodiments of the power supply unit of any of (A20) to (A21), the bus bar connector of the equipment module is located at a distance DT from a top of the equipment module, and the tool-less connection is located at said distance DT from a bottom of the mount.

Numerous details are described herein in order to provide a thorough understanding of the exemplary embodiments illustrated in the accompanying drawings. However, some embodiments may be practiced without many of the specific details, and the scope of the claims is only limited by those features and aspects specifically recited in the claims, including various alternatives, modifications, equivalents and other embodiments, which may be included within the spirit and scope of the claims. Furthermore, well-known components have not been described in exhaustive detail so as not to unnecessarily obscure pertinent aspects of the embodiments described herein.

Figure 1:
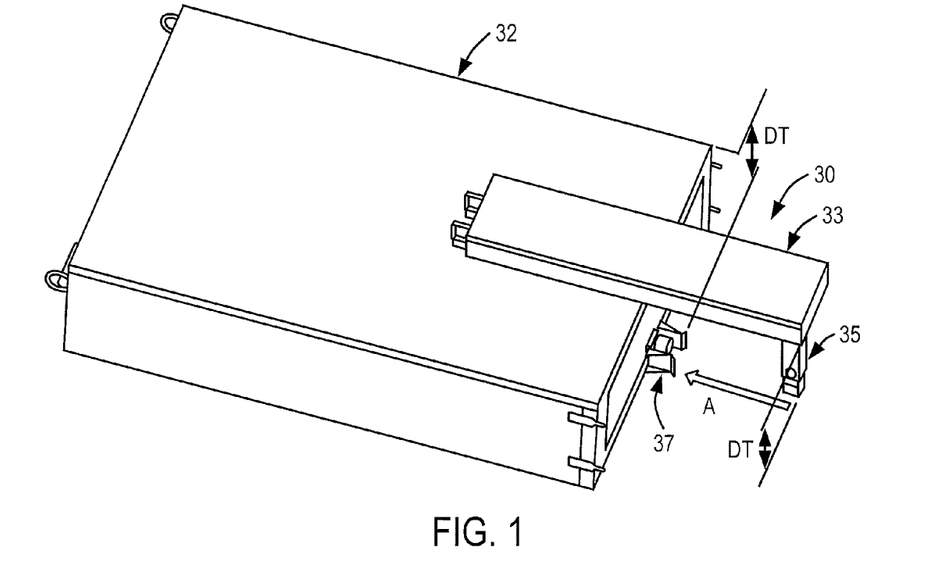
FIG. 1 is a perspective view of an exemplary portable power supply in accordance with various aspects of the present invention, the portable power supply shown as it is being mounted on a rack-mountable equipment module.
Figures 2, 3:
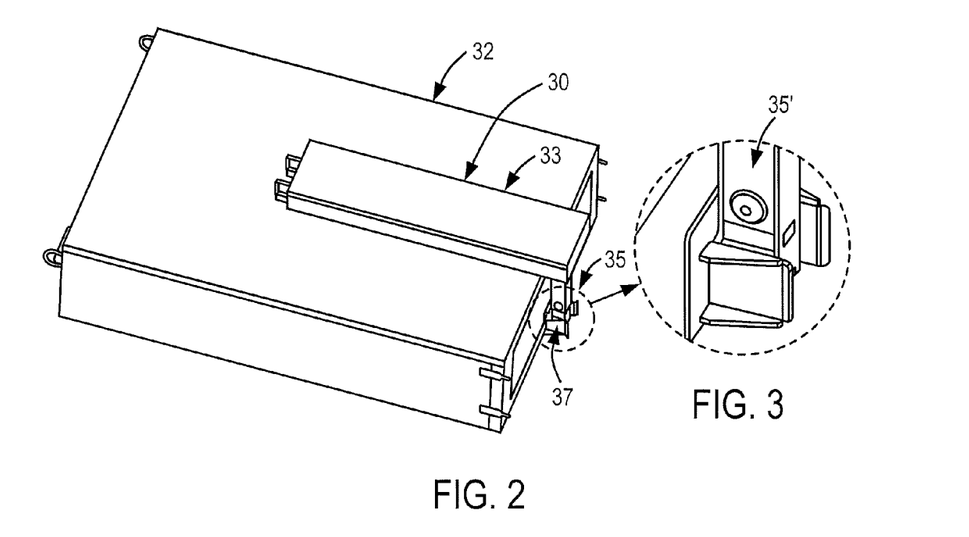
FIG. 2 is a perspective view of the portable power supply of FIG. 1, with the portable power supply shown mounted and electrically connected to the rack-mountable equipment module.
FIG. 3 is an enlarged detail of a tool-less connection of the portable power supply of FIG. 1, the tool-less connection shown engaged with a bus bar connector of the equipment module.

Turning now to the drawings, FIGS. 1 and 2, illustrate an exemplary portable power supply unit 30 that, in accordance with various aspects of the present invention, remotely powers a rack-mountable equipment module 32 of the type that is normally powered by a power distribution system (PDS) of an equipment rack while the equipment module is mounted in the rack. More specifically, in accordance with various aspects of the present invention, the portable power supply unit 30 is configured for powering such an equipment module 32 while it is removed from an equipment rack.

The equipment rack may take various forms, including but not limited to 19-inch racks, 23-inch racks, Open Compute Project (OCP) racks, and etc. For example, a 19-inch rack is a standardized frame or enclosure for mounting multiple equipment modules, each module having a front panel that is 19 inches (482.6 mm) wide, including protrusions on each side that allow the module to be fastened to the equipment rack. Similarly, a 23-inch rack is standardized to accommodate wider equipment modules. Various embodiments of the described power supply unit are particularly suited for use with the OCP equipment rack, which has the same outside dimensions as a conventional 19-inch rack (e.g., 600 mm wide), but is designed to mount wider equipment modules having widths up to about 21 inches (537 mm). The OCP rack configuration allows wider equipment to fit within the overall footprint of a 19-inch rack. Such racks generally include a power distribution system that includes bus bars for ready connection to power all equipment modules mounted on such racks.

The equipment modules are generally configured with industry-accepted dimensions defined in multiples of a "rack unit" (U or RU), or in the case of an OCP rack, defined in multiples of an "OpenU". A typical RU is a unit of measure that describes the height of equipment designed to mount in a 19-inch rack or a 23-inch rack. One rack unit (RU) is 1.75 inches (44.45 mm) high, while an OpenU is slightly larger at 48 mm high. The RU or OpenU represents the overall allocated vertical height of the equipment rack. The actual dimensions of a front panel of an equipment module (or filler panel for a vacant space in a rack) is not an exact multiple of 1.75 inches (44.45 mm). To allow space between adjacent rack-mounted components, an equipment module or a filler panel is generally ⅟₃₂ inch (0.031 inch or 0.79 mm) less in height than the full number of rack units would imply. Thus, a 1U front panel would be 1.719 inches (43.66 mm) high. If n is number of rack units, the formula for panel height is h=(1.750n−0.031) inch=(44.45n−0.79) mm.

As shown in FIGS. 1 and 2, the portable power supply unit 30 generally include a mount 33 and a tool-less connection 35 extending from the end of the mount. In some embodiments, the tool-less connection may extend vertically downward from the end of the mount. In this case, the power supply unit may readily be electrically connected the equipment module by simply resting the mount on top of the equipment module, aligning the tool-less connection with a bus bar connector 37 of the equipment module 32, and sliding the power supply unit in the direction of arrow A such that the tool-less connection electrically engages the bus bar connector 37, as shown in FIGS. 2 and 3. Once the tool-less connection is engaged with the bus bar connector, the power supply unit 30 is ready to supply power to the equipment module 32. In such embodiments, the bus bar connector 37 of the equipment module 32 is located at a distance DT from a top of the equipment module, and the tool-less connection is located at said distance DT from a bottom of the mount.

The tool-less connection 35 (shown as connection 35' in FIG. 3) is configured for engaging the bus bar connector 37 of the equipment module 32 without the use of tools. As noted above, the bus bar connector 37 may be a blind-mate bus bar clip that is compatible with the bus bars of an equipment rack. For example, in the case that the equipment module 32 is designed for an OCP rack, the bus bar connector 37 may be an OCP Connector of the type provided by Methode Electronics, Inc. of Chicago, Ill.

Figure 4:
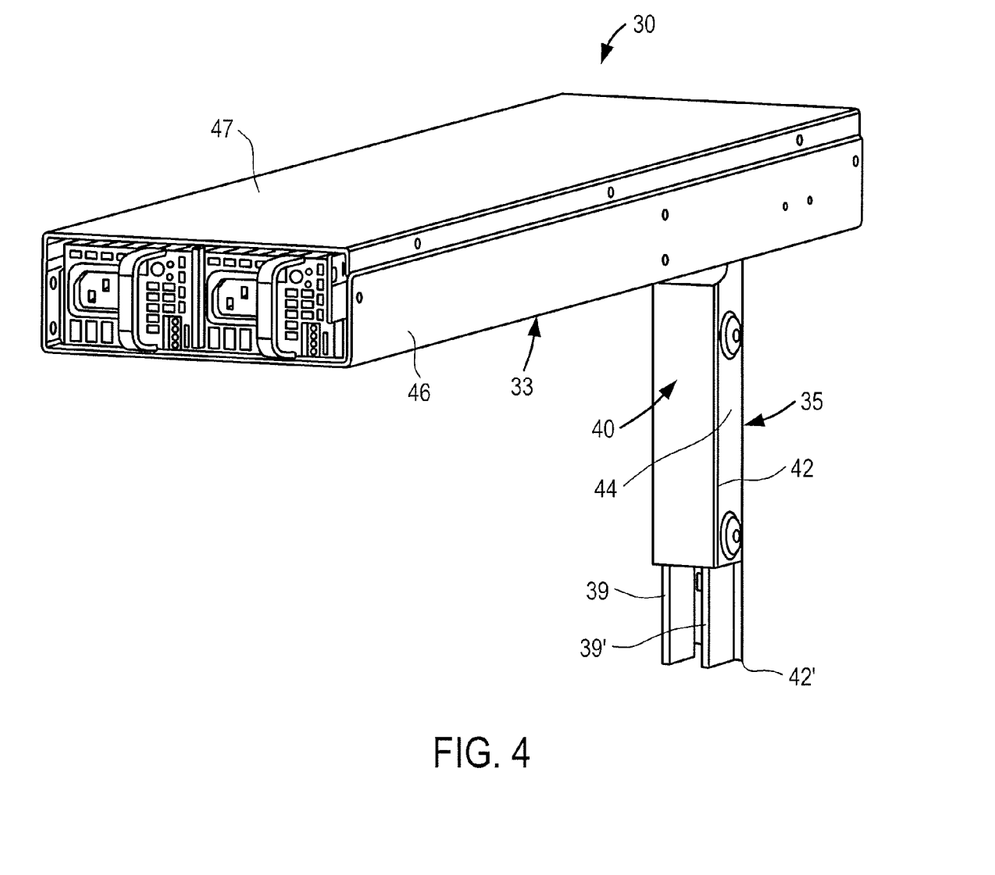
FIG. 4 is an enlarged perspective view of the portable power supply of FIG. 1.
Figures 7, 8:
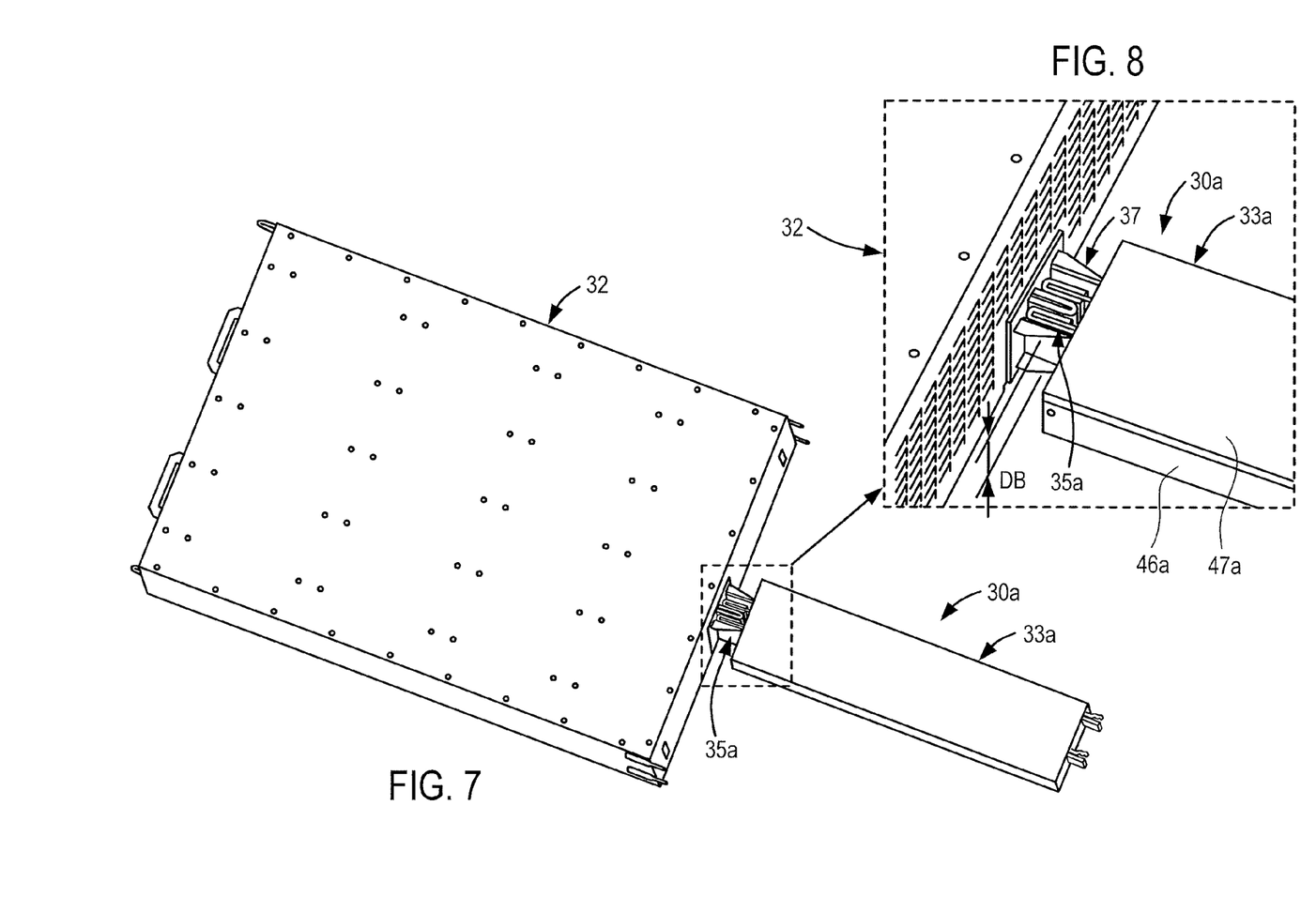
FIG. 7 is a perspective view of another exemplary portable power supply in accordance with various aspects of the present invention, with the portable power supply shown mounted and electrically connected to a rack-mountable equipment module.
FIG. 8 is an enlarged detail view of a tool-less connection of the portable power supply of FIG. 7, the tool-less connection shown engaged with a bus bar connector of the equipment module.
Figure 9:
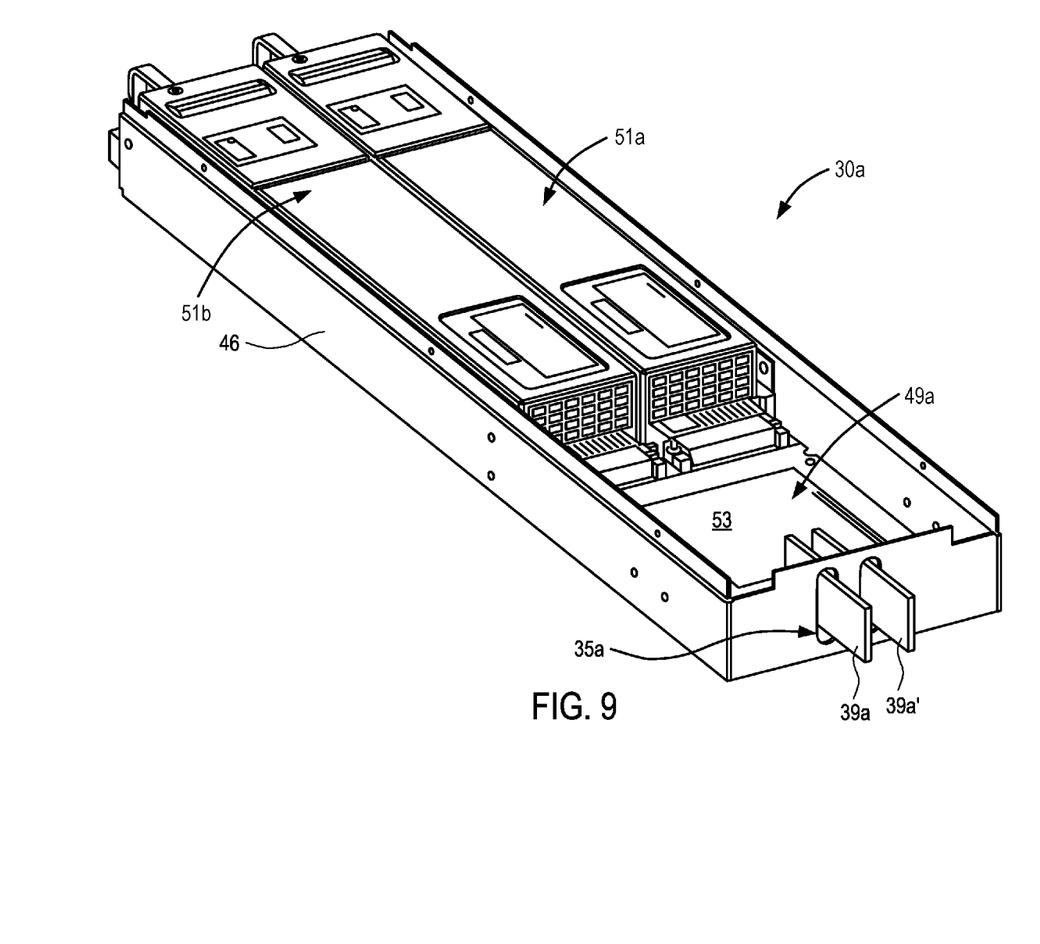
FIG. 9 is an enlarged perspective view of the portable power supply of FIG. 7, the portable power supply shown with a cover removed to view a bus bar adapter located within a housing of the portable power supply.

As shown in FIGS. 4 and 9, the tool-less connection 35 includes a first bus bar 39 and a second bus bar 39' (shown as a first bus bar 39a and a second bus bar 39a' in FIG. 9) spaced from one another. In various embodiments, the first and second bus bars are flat metallic bars that are spaced parallel to one another. In various embodiments, one of the bus bars delivers 12 VDC while the other serves as a ground. In various embodiments, the distance between the first and second bus bars corresponds to the OCP specified distance of the bus bars of the power distribution system of an OCP rack, for example, 17 mm. As such, the first and second bus bars may simply slide into the corresponding sockets or openings of the bus bar connector 37 resulting in a secure unbounded connection between the first and second bus bars and the bus bar connector, as shown in FIGS. 3 and 8.

As shown in FIG. 4, the tool-less connection 35 comprises an insulating spacer 40 separating and insulating the first and second bus bars 39, 39' from one another. In various embodiments, the width of the spacer may correspond to the OCP specified distance of the bus bars of the power distribution system of an OCP rack. In various embodiments, the insulating spacer may include front and rear flanges 42, 42' covering respective front and rear edges of the first and second bus bars. And in various embodiments, the tool-less connection may include insulating side plates 44 covering respective side surfaces of the first and second bus bars.

In various embodiments, the spacer and/or the side plates may be formed of plastic or other suitable insulating materials.

Figure 5:
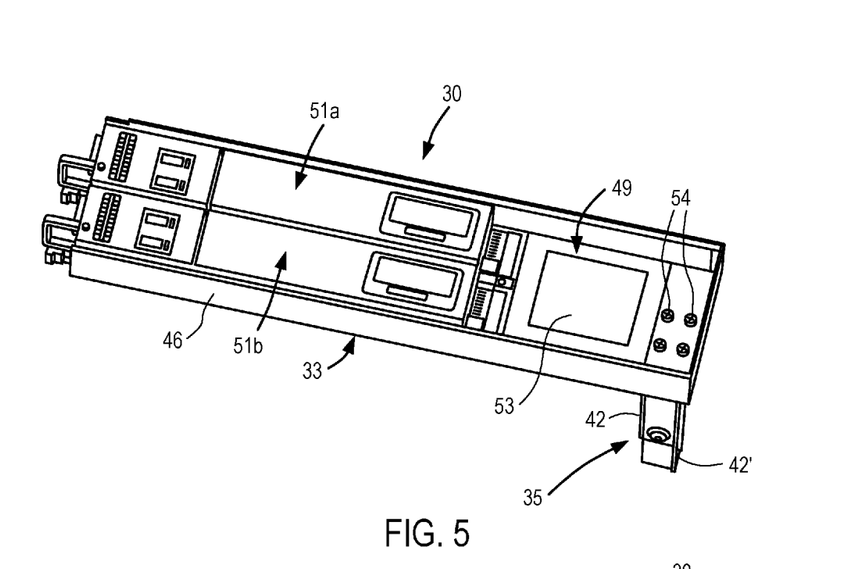
FIG. 5 is a top view of the portable power supply of FIG. 1, the portable power supply shown with a cover removed to view a bus bar adapter located within a housing of the portable power supply.

In various embodiments, the mount 33 may include a housing 46 with a removable cover 47 (shown as cover 47a in FIG. 8) for accessing the various components mounted within the housing. As shown in FIG. 5, the various components generally include a bus bar adapter 49 that electrically connects the tool-less connection 35 to a DC power supply, for example power supply 51a or 51b. In various embodiments, the bus bar adapter is a printed circuit board assembly (PCBA) 53 that provides the circuitry to operably connect the DC voltage of the DC power supply to the first and second bus bars 39, 39'.

In various embodiments, the DC power supply is an AC/DC converter that is configured for converting a readily available input AC voltage to a desired output DC voltage for powering the equipment module. In some embodiments, the converter includes a receptacle mounted on the front of the power supply unit (see FIG. 4) and is configured to be hot pluggable. For example, the AC/DC converter may be configured to convert a standardized alternating current voltage (e.g., 110 VAC, 120 VAC, 220 VAC, 240 VAC, etc.) to a desired direct current voltage (e.g., 12 VDC, 24 VDC, 48 VDC, etc.) in accordance with the specifications of the equipment module. One will appreciate that the converter may be dedicated to a specific conversion (e.g., 120 VAC to 12 VDC), or may be adjustable to convert between a range of voltages (e.g., converting 120 VAC or 240 VAC to 12 VDC, converting 120 VAC to 12 VDC or 24 VDC, converting 120 VAC or 240 VAC to 12 VDC or 24 VDC, etc.). In some embodiments, the portable supply unit 30 includes a plurality of AC/DC converters (shown as DC power supplies 51a and 51b in FIGS. 5 and 9) electrically connected to the bus bar adapter 49. In some embodiments, bus bar adapter is connected to each of the AC/DC converters in parallel.

Figure 6:
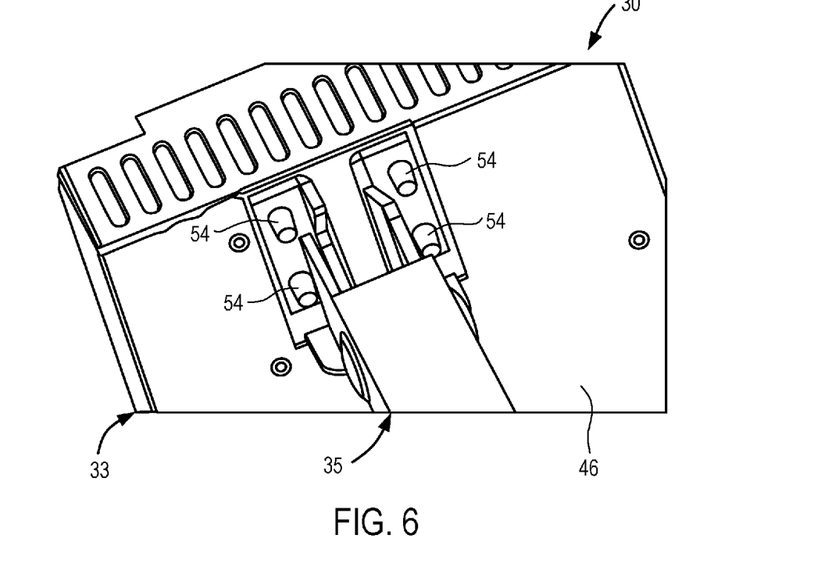
FIG. 6 is an enlarged detailed view the tool-less connection mounted on an underside of the housing of the portable power supply of FIG. 1.

As shown in FIG. 6, fasteners 54 may be used to secure the first and second bus bars 39, 39' to the mount 33 and/or the bus bar adapter 49. In the illustrated embodiment, the fasteners are screws secured with lock nuts (not shown), however, one will appreciate that other suitable fasteners may be utilized including, but not limited to, screws without lock nuts, solder, rivets and the like. One will also appreciate that the fasteners may be used to secure the bus bar adapter 49 to the mount 33. In various embodiments, the fasteners 54 also electrically connect the first and second bus bars 39, 39' to the bus bar adapter 49. As shown in FIG. 6, insulation 56 may be provided to insulate the mount 33 (e.g., housing 46, shown as housing 46a in FIG. 8) from the first and second bus bars 39, 39'.

As shown in FIG. 7, in some embodiments, the mount 33a is horizontally elongated, and the tool-less connection 35a extends horizontally from the end of the mount. In this case, the power supply unit may readily be electrically connected the equipment module by simply resting the mount on the same work surface upon which the equipment module 32 rests, aligning the tool-less connection with the bus bar connector 37 of the equipment module 32, and sliding the power supply unit 30a toward the equipment module such that the tool-less connection 35a electrically engages the bus bar connector 37, as shown in FIGS. 7 and 8. Once the tool-less connection is engaged with the bus bar connector, the power supply unit 30a is ready to supply power to the equipment module 32. In such embodiments, the bus bar connector 37 of the equipment module 32 is located at a distance DB from a bottom of the equipment module, and the tool-less connection 35a is located at such distance DB from a bottom of the mount 33a.

As shown in FIG. 9, the bus bar adapter 49a and the DC power supplies 51a and 51b may be similar to those described above.

It will be understood that, although the terms "first," "second," etc. may be used herein to describe various elements, these elements should not be limited by these terms. These terms are only used to distinguish one element from another. For example, a first end could be termed a second end, and, similarly, a second end could be termed a first end, without changing the meaning of the description, so long as all occurrences of the "first end" are renamed consistently and all occurrences of the "second end" are renamed consistently. The first end and the second end are both ends, but they are not the same end.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In many respects, various modified features of the various figures resemble those of preceding features and the same reference numerals followed by subscripts "a" designate corresponding parts.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A portable power supply unit for powering a rack-mountable equipment module, the equipment module including an equipment chassis and a bus bar connector extending from the equipment chassis, the bus bar connector being configured to engage a power distribution system of an equipment rack when the equipment module is mounted in the equipment rack, the portable power supply unit comprising:
   a DC power supply;
   a bus bar adapter electrically connected to the DC power supply;
   a mount for supporting the DC power supply and the bus bar adapter, the mount having an end; and
   a tool-less connection electrically connected to the bus bar adapter and extending from the end of the mount, the tool-less connection being configured for engaging the bus bar connector of the equipment module;
   wherein the portable power supply unit is configured to power the equipment module while the equipment module is not installed in the equipment rack.

2. A power supply unit according to claim 1, wherein the bus bar adapter is a printed circuit board assembly (PCBA).

3. A power supply unit according to claim 1, wherein the mount includes a housing for enclosing the bus bar adapter, wherein the tool-less connection extends from an end of the housing.

4. A power supply unit according to claim 3, wherein the housing includes a removable cover for accessing the bus bar adapter within the housing.

5. A power supply unit according to claim 1, wherein the tool-less connection serves as a DC voltage output of the bus bar adapter.

6. A power supply unit according to claim 1, wherein the DC power supply is an AC/DC converter for converting an input AC voltage to an output DC voltage for the bus bar adapter.

7. A power supply unit according to claim 6, wherein the AC/DC converter is supported by the mount.

8. A power supply unit according to claim 6, wherein the input of the AC/DC converter is configured to receive 100-240 VAC.

9. A power supply unit according to claim 6, wherein the output of the AC/DC converter is configured to provide a DC voltage in the range of 12 VDC to 48 VDC.

10. A power supply unit according to claim 1, wherein the portable power supply unit comprises a plurality of AC/DC converters, and the bus bar adapter is electrically connected to each of the AC/DC converters.

11. A power supply unit according to claim 1, wherein the tool-less connection is configured for engaging the bus bar connector of the equipment module via one or more bus bars protruding from the tool-less connection.

12. A power supply unit according to claim 1, wherein the mount is horizontally elongated and the tool-less connection extends vertically from the end of the mount.

13. A power supply unit according to claim 12, wherein the tool-less connection is dimensioned and configured to engage the bus bar connector of the rack-mountable equipment module while the power supply unit is resting on top of the rack-mountable equipment module.

14. A power supply unit according to claim 12, wherein the bus bar connector of the equipment module is located at a distance DT from a top of the equipment module, and the tool-less connection is located at said distance DT from a bottom of the mount.

15. A portable power supply unit for powering a rack-mountable equipment module, the equipment module including an equipment chassis and a bus bar connector extending from the equipment chassis, the bus bar connector being configured to engage a power distribution system of an equipment rack when the equipment module is mounted in the equipment rack, the portable power supply unit comprising:
 a DC power supply;
 a bus bar adapter electrically connected to the DC power supply;
 a mount for supporting the DC power supply and the bus bar adapter, the mount having an end; and
 a tool-less connection electrically connected to the bus bar adapter and extending from the end of the mount, the tool-less connection being configured for engaging the bus bar connector of the equipment module;
 wherein the tool-less connection includes a first bus bar and a second bus bar spaced from the first bus bar, the first bus bar and the second bus bar being electrically connected to the bus bar adapter and extending from the end of the mount, and wherein the first bus bar and the second bus bar are configured to engage the bus bar connector of the equipment module.

16. A power supply unit according to claim 15, wherein the first bus bar and the second bus bar are flat metallic bars that are spaced parallel to one another.

17. A power supply unit according to claim 15, wherein the first bus bar and the second bus bar are configured to engage an input power connector of an Open Compute Project (OCP) product.

18. A power supply unit according to claim 15, wherein the tool-less connection comprises an insulating spacer separating and insulating the first bus bar and the second bus bar from one another.

19. A power supply unit according to claim 18, wherein the insulating spacer includes front and rear flanges covering respective front and rear edges of the first bus bar and the second bus bar.

20. A power supply unit according to claim 15, wherein the tool-less connection comprises insulating side plates covering respective side surfaces of the first bus bar and the second bus bar.

21. A portable power supply unit for powering a rack-mountable equipment module, the equipment module including an equipment chassis and a bus bar connector extending from the equipment chassis, the bus bar connector being configured to engage a power distribution system of an equipment rack when the equipment module is mounted in the equipment rack, the portable power supply unit comprising:
 a DC power supply;
 a bus bar adapter electrically connected to the DC power supply;
 a mount for supporting the DC power supply and the bus bar adapter, the mount having an end; and
 a tool-less connection electrically connected to the bus bar adapter and extending from the end of the mount, the tool-less connection being configured for engaging the bus bar connector of the equipment module;
 wherein the mount is horizontally elongated, and the tool-less connection extends horizontally from the end of the mount.

22. A power supply unit according to claim 21, wherein the bus bar connector of the equipment module is located at a distance DB from a bottom of the equipment module, and the tool-less connection is located at said distance DB from a bottom of the mount.

* * * * *